(12) United States Patent
Ou

(10) Patent No.: US 8,966,159 B2
(45) Date of Patent: Feb. 24, 2015

(54) FLASH STORAGE DEVICE AND DATA WRITING METHOD THEREOF

(75) Inventor: Hsu-Ping Ou, Zhubei (TW)

(73) Assignee: Silicon Motion, Inc., Jhubei (TW)

( * ) Notice: Subject to any disclaimer, the term of this patent is extended or adjusted under 35 U.S.C. 154(b) by 453 days.

(21) Appl. No.: 13/337,970

(22) Filed: Dec. 27, 2011

(65) Prior Publication Data

US 2012/0166718 A1    Jun. 28, 2012

(30) Foreign Application Priority Data

Dec. 28, 2010    (TW) ................................ 99146320 A

(51) Int. Cl.
*G06F 12/00* (2006.01)
*G06F 12/02* (2006.01)
*G11C 16/06* (2006.01)

(52) U.S. Cl.
CPC ............ *G06F 12/0246* (2013.01); *G11C 16/06* (2013.01)
USPC .......................................... 711/103; 711/166

(58) Field of Classification Search
CPC ...... G06F 12/0246; G06F 2212/75–2212/7211
USPC ................................................. 711/103, 166
See application file for complete search history.

(56) References Cited

U.S. PATENT DOCUMENTS

| | | | |
|---|---|---|---|
| 6,246,634 B1 | 6/2001 | Nojima | |
| 7,702,831 B2 | 4/2010 | Ma et al. | |
| 7,849,242 B2 | 12/2010 | Lee et al. | |
| 2005/0141312 A1* | 6/2005 | Sinclair et al. | ................ 365/222 |
| 2005/0144361 A1 | 6/2005 | Gonzalez | |
| 2009/0180209 A1 | 7/2009 | Maeda | |
| 2010/0088462 A1* | 4/2010 | Kuo et al. | ...................... 711/103 |
| 2010/0095046 A1* | 4/2010 | Reid et al. | ..................... 711/102 |

FOREIGN PATENT DOCUMENTS

| | | |
|---|---|---|
| CN | 101334781 | 12/2008 |
| CN | 101446922 | 6/2009 |
| TW | 200951979 A1 | 12/2009 |
| TW | 201013401 A1 | 4/2010 |

OTHER PUBLICATIONS

Office Action of corresponding TW application, issued on Jul. 15, 2013.
Office Action of corresponding CN application published on Feb. 14, 2014.

* cited by examiner

*Primary Examiner* — Kalpit Parikh
(74) *Attorney, Agent, or Firm* — Wang Law Firm, Inc.; Li K. Wang; Stephen Hsu

(57) ABSTRACT

A flash storage device comprises a flash memory and a controller. The flash memory comprises a plurality of blocks comprising a plurality of ordinary pages and a plurality of reserved pages. The controller receives a current write command and write data from a host, determines a mother block and an FAT block corresponding to the write command, divides data of the mother block and data of the FAT block into a plurality of original data segments and a plurality of updating data segments, integrates the original data segments with the updating data segments to obtain integrated data segments, writes the integrated data segments to an integrated block respectively in a plurality of processing periods of a plurality of subsequent write commands, and writes the subsequent write data to the reserved pages of a plurality of subsequent blocks.

12 Claims, 16 Drawing Sheets

FLASH STORAGE DEVICE AND DATA WRITING METHOD THEREOF

CROSS REFERENCE TO RELATED APPLICATIONS

This Application claims the benefit of priority to Taiwan Patent Application No. 99146320, filed on Dec. 28, 2010, the entirety of which is incorporated by reference herein.

BACKGROUND OF THE INVENTION

1. Field of the Invention

The invention relates to memories, and more particularly to flash memories.

2. Description of the Related Art

A flash storage device stores data for a host and processes write commands sent from the host. The flash storage device comprises a flash memory and a controller. When the controller receives a write command from the host, the controller writes data to the flash memory according to the write command. The flash memory comprises a plurality of blocks, and each block comprises a plurality of pages for data storage. Each page of a block corresponds to a unique physical address. The host specifies data of a page or a block according a logical address. The physical addresses are converted to the logical addresses according to a 1-to-1 mapping relationship.

When the host wants to replace original data stored in a logical address with updated data, because the original data has been stored in an old block corresponding to the logical address, the controller cannot directly write the updated data to the old block of the logical address. The controller therefore writes the updated data to a new block. The new block storing updated data therefore has the same logical address as the logical address of the old block, and the new block therefore corresponds to the old block. Ordinarily, the old block is referred to as a mother block. The new block is named as a file allocation table (FAT) block or a child block according to the format thereof. If the new block can only be written with data with continuous addresses, the new block is referred to as a child block. If the new block can be written with data with discontinuous addresses, the new block is referred to as an FAT block.

The child block can only be written with data with continuous addresses. When the controller receives a write command comprising updated data with discontinuous addresses, the controller cannot directly write the updated data to the child block. The controller therefore performs data integration of the mother block and the child block to obtain an integrated block. In addition, the FAT block has limited data capacity. When the controller receives a write command comprising updated data to be written to an FAT block, and the FAT block is full of data, thus, the controller cannot write the updated to the FAT block. The controller therefore performs data integration of the mother block and the FAT block to obtain an integrated block.

With improved manufacturing technology of flash memory chips, a block of a flash memory chip now has more and more pages, increasing the data capacity of the flash memory chip. The speed for a controller to write data to the flash memory chip, however, has not correspondingly increased. When data integration of a mother block and an FAT block is performed, the data integration takes a lot of time and results in system delay. The controller, however, only has a limited processing time of 250 ms to process a write command. If processing of a write command requires data integration of a mother block, an FAT block, and a child block, the data integration requires a time period longer than 250 ms, leading to errors in the data writing process. Thus, a data writing method is required to complete data integration in compliance with the limitations of the 250 ms processing period of write commands.

BRIEF SUMMARY OF THE INVENTION

The invention provides a flash storage device. In one embodiment, the flash storage device is coupled to a host, and comprises a flash memory and a controller. The flash memory comprises a plurality of blocks, wherein each of the blocks comprises a plurality of ordinary pages and a plurality of reserved pages. The controller receives a current write command and write data from the host, determines a mother block corresponding to the write command, determines whether data integration of the mother block and a file allocation table (FAT) block is needed in execution of the current write command, divides data of the mother block and data of the FAT block into a plurality of original data segments and a plurality of updating data segments when the data integration is needed, integrates the original data segments with the updating data segments to obtain integrated data segments, receives a plurality of subsequent write commands and subsequent write data from the host, writes the integrated data segments to an integrated block respectively in a plurality of processing periods of the subsequent write commands, and writes the subsequent write data to the reserved pages of a plurality of subsequent blocks corresponding to the subsequent write commands during the processing periods of the subsequent write commands.

The invention also provides a data writing method of a flash storage device. In one embodiment, the flash storage device is coupled to a host and comprises a flash memory comprising a plurality of blocks, and each of the blocks comprises a plurality of ordinary pages and a plurality of reserved pages. First, a current write command and write data is received from the host. A mother block corresponding to the write command is then determined. Whether data integration of the mother block and a file allocation table (FAT) block is needed in execution of the write command is then determined. When the data integration is needed, data of the mother block and data of the FAT block are divided into a plurality of original data segments and a plurality of updating data segments. The original data segments are then integrated with the updating data segments to obtain integrated data segments. A plurality of subsequent write commands and subsequent write data are then received from the host. The integrated data segments are then written to an integrated block respectively in a plurality of processing periods of the subsequent write commands. The subsequent write data is then written to the reserved pages of a plurality of subsequent blocks corresponding to the subsequent write commands during the processing periods of the subsequent write commands.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
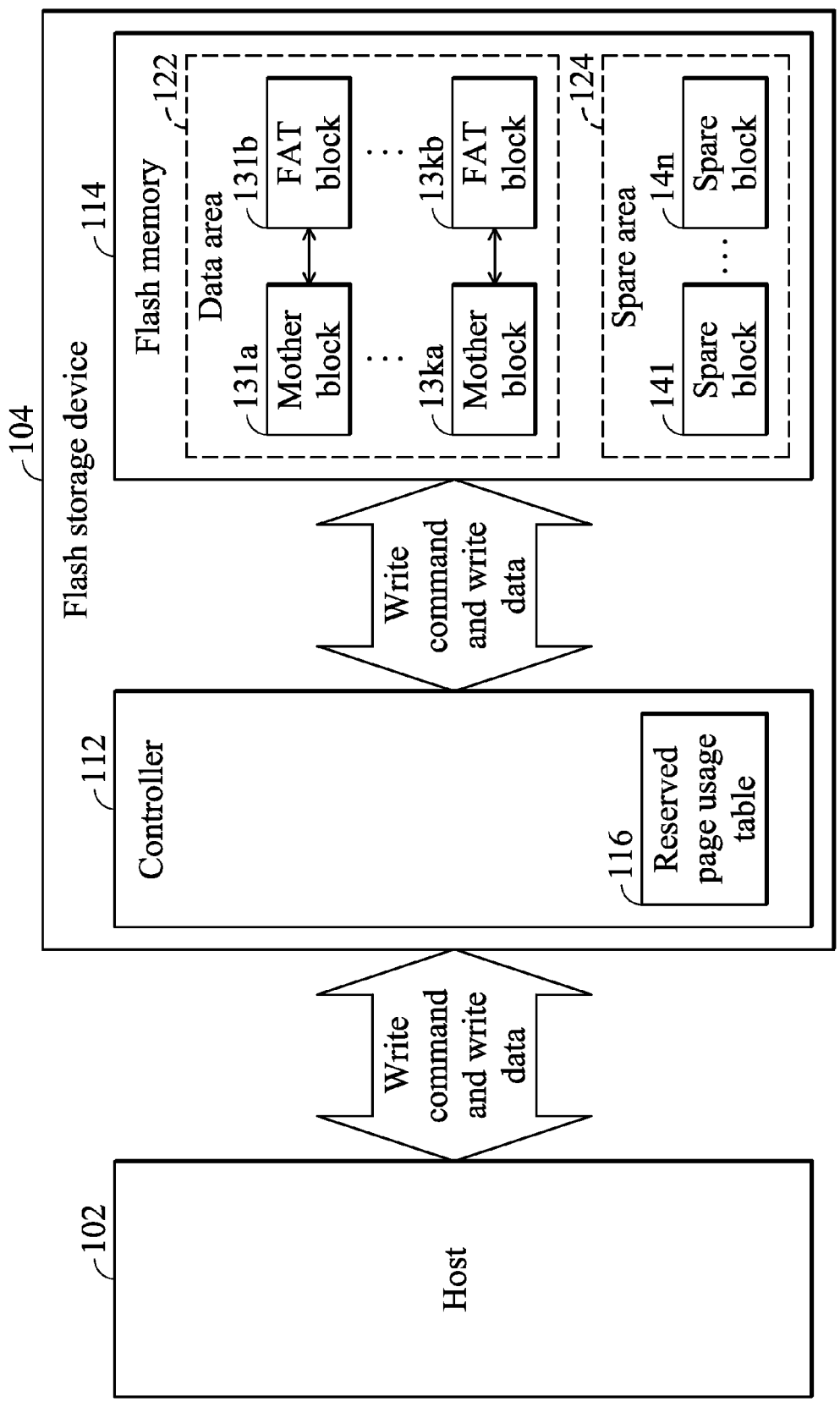
FIG. 1 is a block diagram of a flash storage device according to the invention.

Referring to FIG. 1, a block diagram of a flash storage device 104 according to the invention is shown. The flash storage device 104 is coupled to a host 102 and stores data for the host 102. In one embodiment, the flash storage device 104 comprises a controller 112 and a flash memory 114. The controller 112 receives write commands and a write data from the host 102, and writes the write data to the flash memory 114 according to the write commands. The flash memory 114 comprises a plurality of blocks, and each block comprises a plurality of pages for data storage. The blocks of the flash memory 114 are divided into a data area 122 and a spare area 124. The blocks in the data area 122 has stored user data therein. The blocks in the spare area 124 are spare blocks where no data is stored. When the host 102 wants to write update data to a logical address corresponding to a mother block in which original data has been stored, the controller 112 cannot directly write the update data to the mother block. The controller 112 therefore retrieves a spare block from the spare area 124 as an FAT block for storage of the update data. The FAT block 131b therefore has the same logical address as that of the mother block 131a. Similarly, the controller 112 can also retrieve a spare block from the spare area 124 as a child block for storage of the update data, and the child block therefore has the same logical address as that of the mother block.

Figure 2:
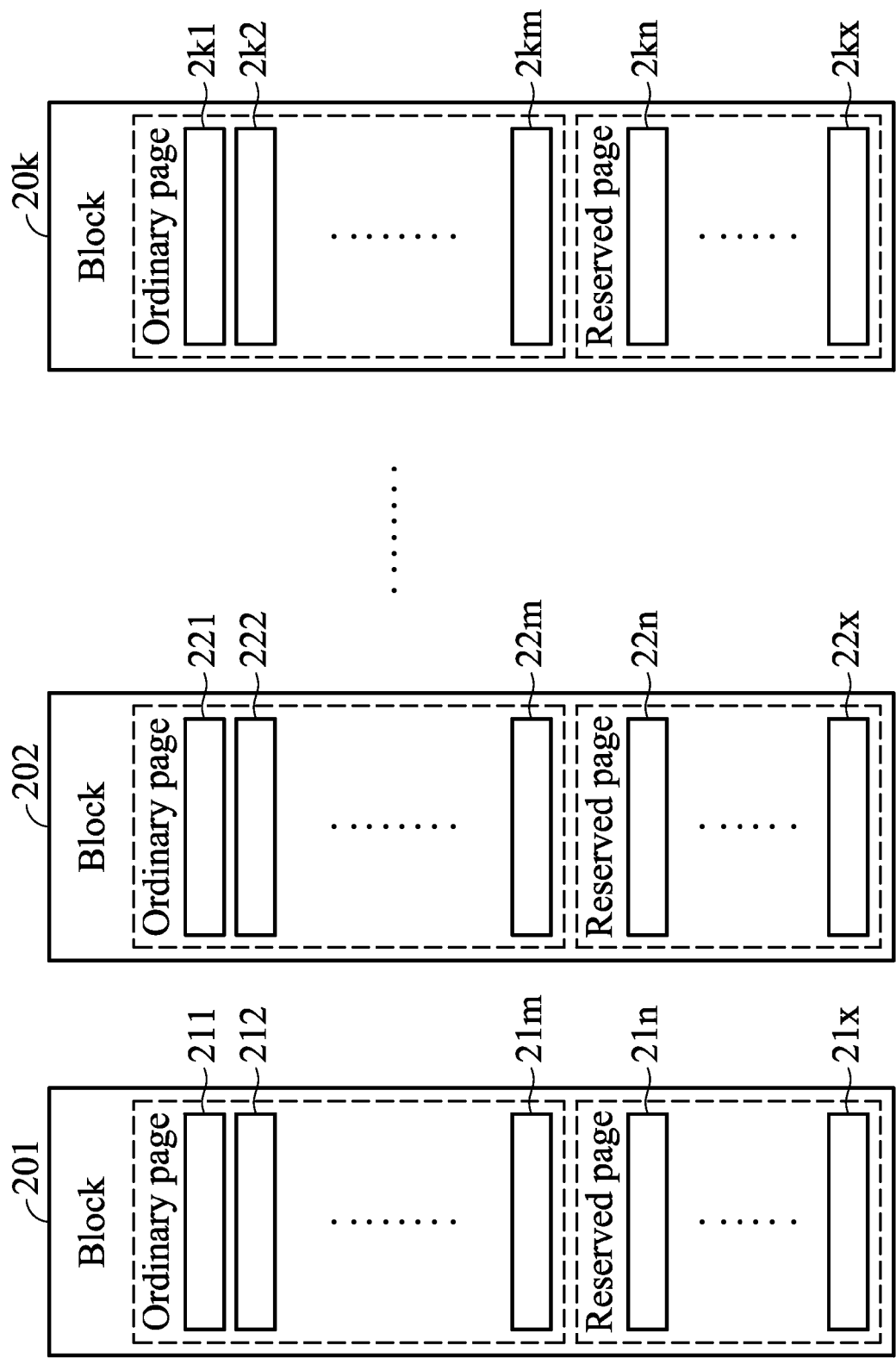
FIG. 2 is a schematic diagram of pages of a plurality of blocks of a flash memory according to the invention.

Referring to FIG. 2, a schematic diagram of pages of a plurality of blocks of the flash memory 114 according to the invention is shown. All pages of a block of an ordinary flash memory are used to store user data. On the contrary, the pages of each block of the flash memory 114 according to the invention are divided into ordinary pages are reserved pages. The ordinary pages are used to store user data, and the reserved pages are used to store system data rather than user data. Each block of the flash memory 114 has a predetermined number of reserved pages. When the host 102 wants to write data to a block, the controller 112 writes the data to ordinary pages of the block, and does not write the data to reserved pages of the block. For example, the block 201 comprises m ordinary pages 211~21m and (x-n+1) reserved pages 21n~21x, and the block 221 comprises m ordinary pages 221~22m and (x-n+1) reserved pages 22n~22x. In one embodiment, a processing period of a write command is $T_1$, a time period for writing data to all ordinary pages of a block is $T_2$, and the number of reserved pages of each block of the flash memory 114 is greater than a quotient $(T_2/T_1)$.

Figure 3A:
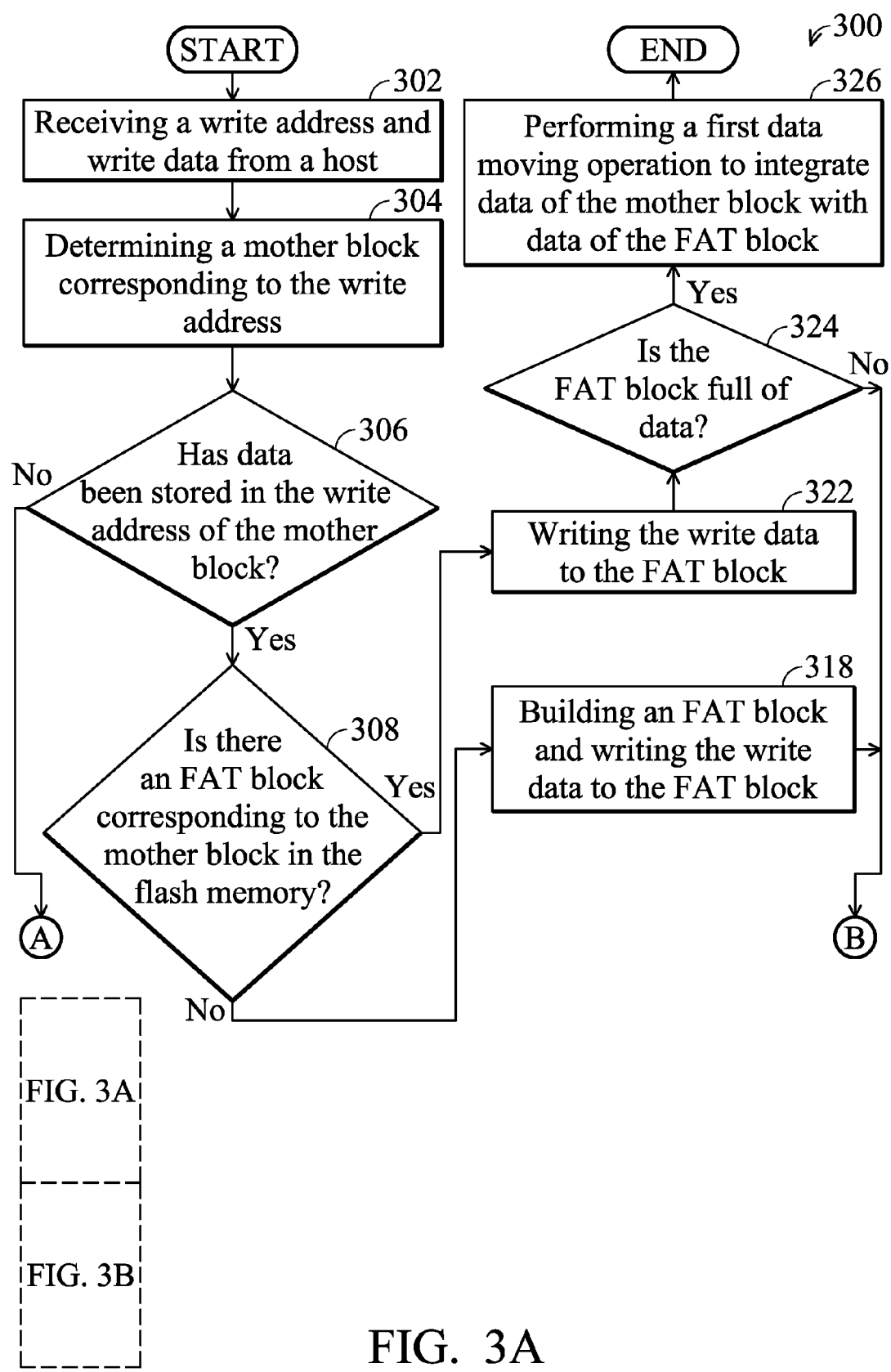
FIGS. 3A and 3B are a flowchart of a data writing method according to the invention.
Figure 3B:
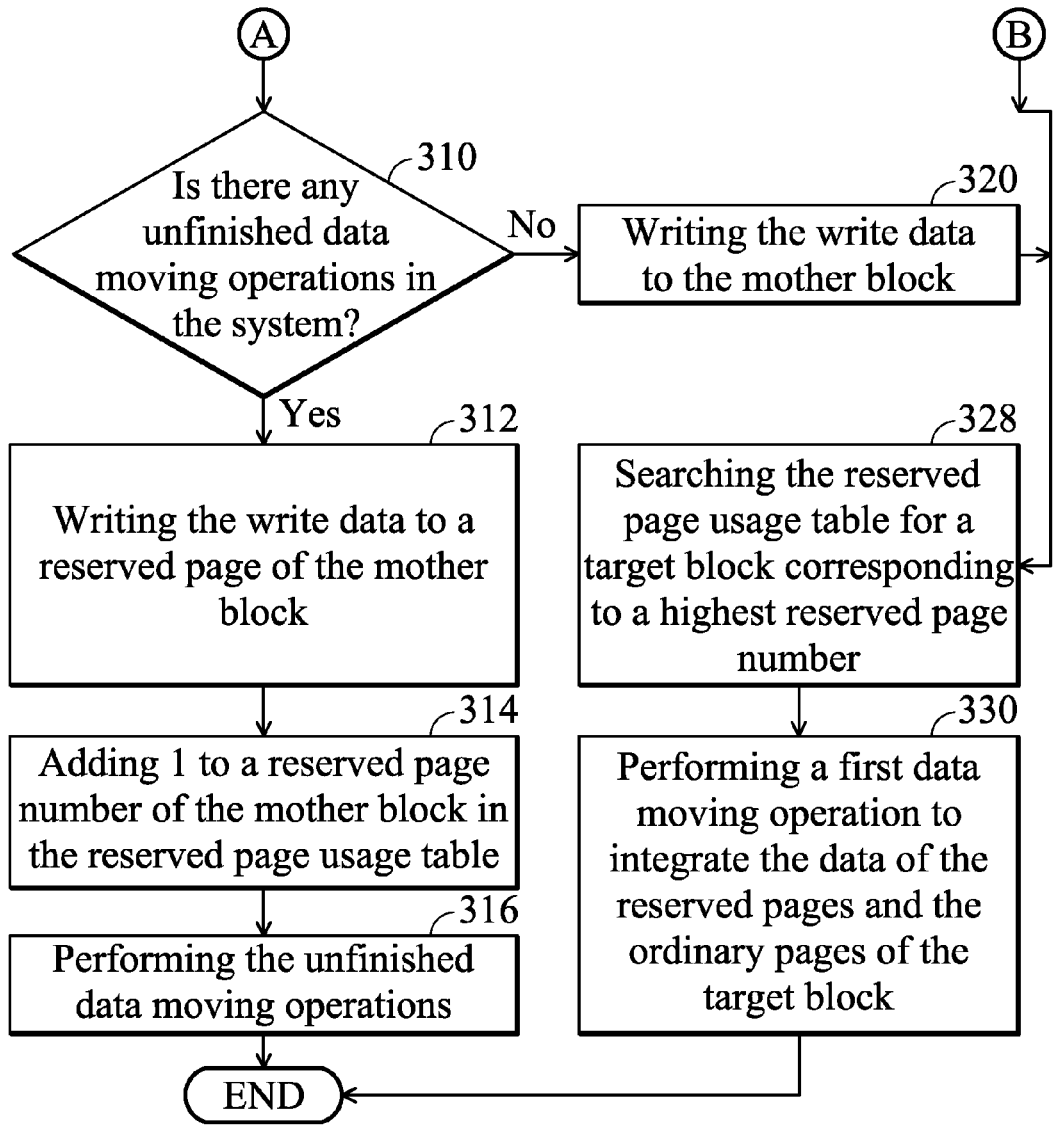

When the controller 112 receives a write command and write address from the host 102, the controller 112 must write the write data to a block of the flash memory 114. Referring to FIGS. 3A and 3B, a flowchart of a data writing method 300 according to the invention is shown. The controller 112 processes write commands received from the host 102 according to the method 300. First, the controller 112 receives a write command and write data from the host 102 (step 302). The controller 112 then determines a mother block corresponding to the write address (step 304). The controller 112 then determines whether data has been stored in the write address of the mother block (step 306). When data has been stored in the write address of the mother block, the controller 112 must write the write data to an FAT block. The controller 112 therefore determines whether an FAT block corresponding to the mother block exists in the flash memory (step 308). If not, the controller 112 obtains a spare block as the FAT block and writes the write data to the FAT block (step 318). Otherwise, when an FAT block exists in the flash memory 114 (step 308), the controller 112 writes the write data to the FAT block (step 322).

The controller 112 then determines whether the FAT block is full of data (step 324). If so, the FAT block cannot be written with any new data. The controller 112 therefore must integrate the original data stored in the mother block and the update data stored in the FAT block into integrated data, and then writes the integrated data to a spare block to obtain an integrated block. Because the data amount to be integrated is a data block, the time required by data integration is longer than the limited time period of 250 ms for processing a single write command. The controller 112 therefore must divide the integrated data into a plurality of integrated data segments to be respectively written to the integrated block. Thus, the time period for writing a single integrated data segment to the integrated block is not longer than the limited time period of 250 ms for processing a single write command. During the processing period of the current write command, the controller 112 performs a first data moving operation to write a first integrated data segment to the integrated block (step 326). After the controller 112 sequentially receives a plurality of subsequent write commands, the controller 112 then sequentially performs a second data moving operation, a third data moving operation, . . . , and a K-th data moving operation to respectively write a second integrated data segment, a third integrated data segment, . . . , and a K-th integrated data segment to the integrated block during the processing periods of the subsequent write commands. The data moving operations will be further illustrated in FIGS. 4 and 5.

If there is no data stored in the write address of the mother block (step 306), the controller 112 determines whether there is any unfinished data moving operation in the system (step 310). If there is an unfinished data moving operation in the system, the controller 112 writes the write data to a reserved page of the mother block (step 312), and adds 1 to a reserved page number of the mother block in a reserved page usage table 116 (step 314). The reserved page usage table 116 records the numbers of reserved pages being used by the blocks of the flash memory 114. The controller 112 can then continue to perform the unfinished data moving operations. For example, if there are a second data moving operation, a third data moving operation, . . . , and a K-th data moving operation waiting to be performed in the system, the controller 112 performs the second data moving operation to write a second integrated data segment to the integrated block during the processing period of the current write command. If there is no unfinished data moving operation in the system, the controller 112 directly writes the write data to the mother block (step 320).

Figure 6:
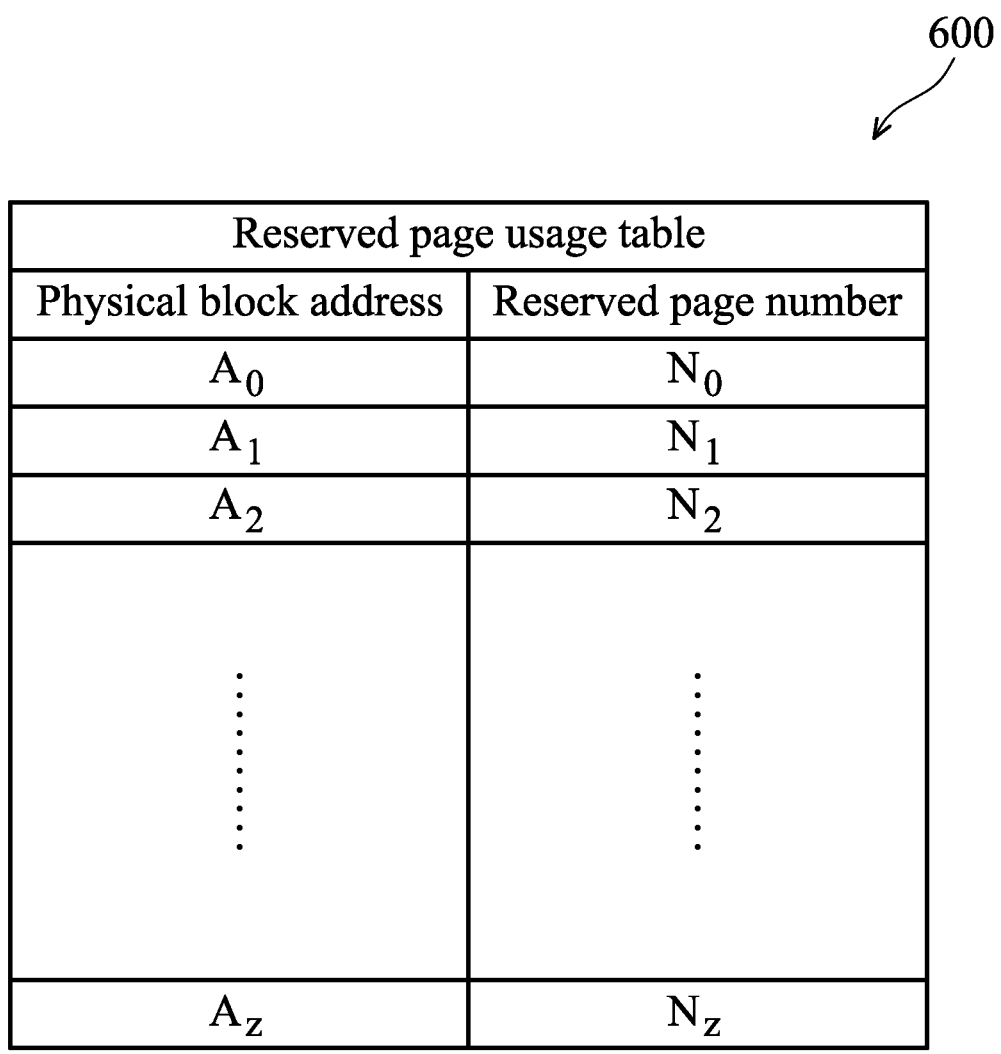
FIG. 6 is an embodiment of a reserved page usage table according to the invention.

After the controller 112 writes the write data to the FAT block (steps 318, 324) or the mother block (step 320), the controller 112 can use the remaining processing time of the current write command to perform data integration of the reserved pages and ordinary pages of blocks. First, the controller 112 searches the reserved page usage table 116 for a target block corresponding to the highest reserved page number (step 328). Referring to FIG. 6, an embodiment of a reserved page usage table 600 according to the invention is shown. The reserved page usage table 600 comprises two columns. One column of the reserved page usage table 600 records physical block addressed of all blocks of the flash memory 114, and the other column of the reserved page usage table 600 records the number of the reserved pages used by the corresponding blocks. The controller 112 can therefore search the reserved page usage table 600 for the target block corresponding to the highest reserved page number. The controller 112 then performs a first data moving operation to integrate the data of the reserved pages and the ordinary pages of the target block (step 330). The update data stored in the reserved pages of the target block must be integrated with the original data stored in the ordinary pages of the target block to obtain integrated data, and the integrated data is then written to a spare block to obtain an integrated block.

Because the data amount to be integrated is a data block, the time required by data integration is longer than the limited time period of 250 ms for processing a single write command. The controller 112 therefore must divide the integrated data into a plurality of integrated data segments to be respectively written to the integrated block. Thus, the time period for writing a single integrated data segment to the integrated block is not longer than the limited time period of 250 ms for processing a single write command. During the processing period of the current write command, the controller 112 performs a first data moving operation to write a first integrated data segment to the integrated block (step 330). After the controller 112 sequentially receives a plurality of subsequent write commands, the controller 112 then sequentially performs a second data moving operation, a third data moving operation, . . . , and a K-th data moving operation to respectively write a second integrated data segment, a third integrated data segment, . . . , and a K-th integrated data segment to the integrated block during the processing periods of the subsequent write commands. The data moving operations will be further illustrated in FIG. 7.

Figure 3C:
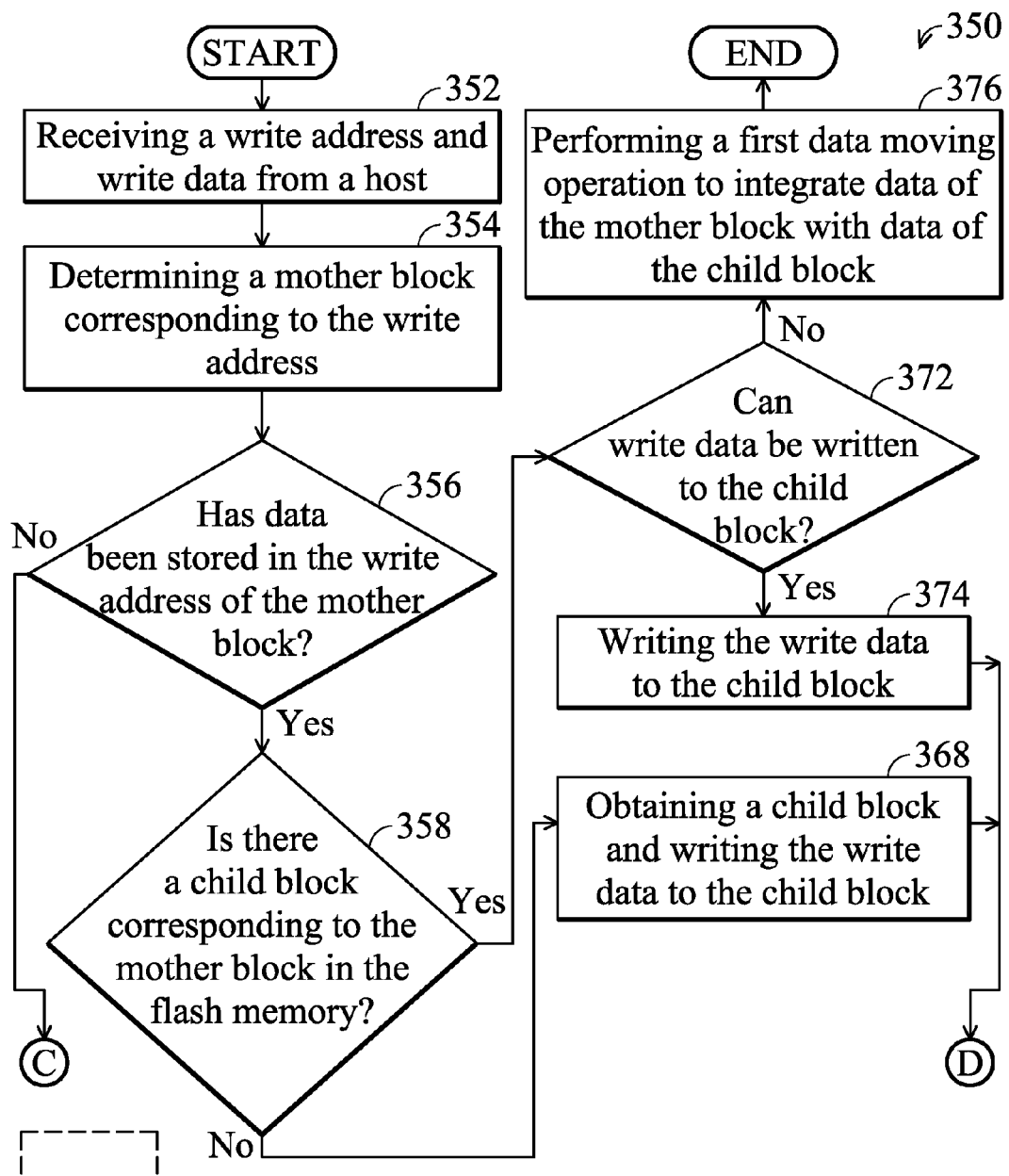
FIGS. 3C and 3D are a flowchart of another embodiment of a data writing method according to the invention.
Figure 3D:
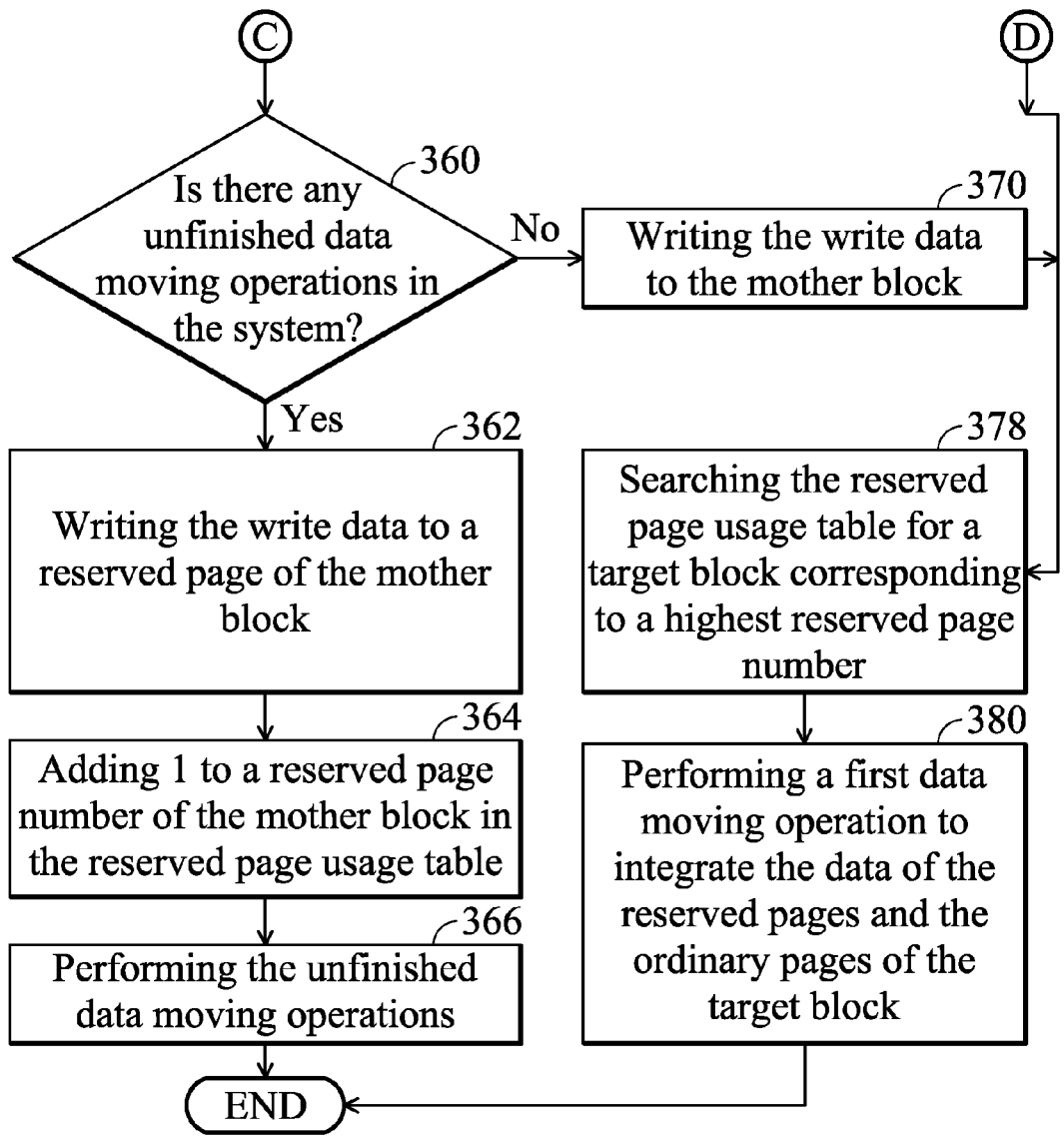

Referring to FIGS. 3C and 3D, a flowchart of another embodiment of a data writing method 350 according to the invention is shown. The difference between the data writing method 350 and the data writing method 300 is that the FAT block appearing in the steps of the data writing method 300 is replaced with a child block in the steps of the data writing method 350. Update data with continuous addresses can be written to a child block, and update data with discontinuous addresses can only be written to an FAT block. When the controller 112 finds a child block corresponding to the mother block in the flash memory 114 (step 358), the controller 112 determines whether the write data can be written to the child block (step 372). If the address of the write data is next to a last address of the data stored in the child block, the write data can be written to the child block, and the controller 112 writes the write data to the child block (step 374). If the address of the write data is not next to the last address of the data stored in the child block, the write data can not be written to the child block. The controller 112 therefore must integrate the original data stored in the mother block with the update data stored in the child block to obtain integrated data, and then writes the integrated data to a spare block to obtain an integrated block. Similarly, the controller 112 must divide the integrated data into a plurality of integrated data segments to be respectively written to the integrated block. Thus, the time period for writing a single integrated data segment to the integrated block is not longer than the limited time period of 250 ms for processing a single write command. During the processing period of the current write command, the controller 112 performs a first data moving operation to write a first integrated data segment to the integrated block (step 376). After the controller 112 sequentially receives a plurality of subsequent write commands, the controller 112 then sequentially performs a second data moving operation, a third data moving operation, . . . , and a K-th data moving operation to respectively write a second integrated data segment, a third integrated data segment, . . . , and a K-th integrated data segment to the integrated block during the processing periods of the subsequent write commands. The other steps of the FIGS. 3C and 3D are similar with the corresponding steps of the FIGS. 3A and 3B.

Figure 4:
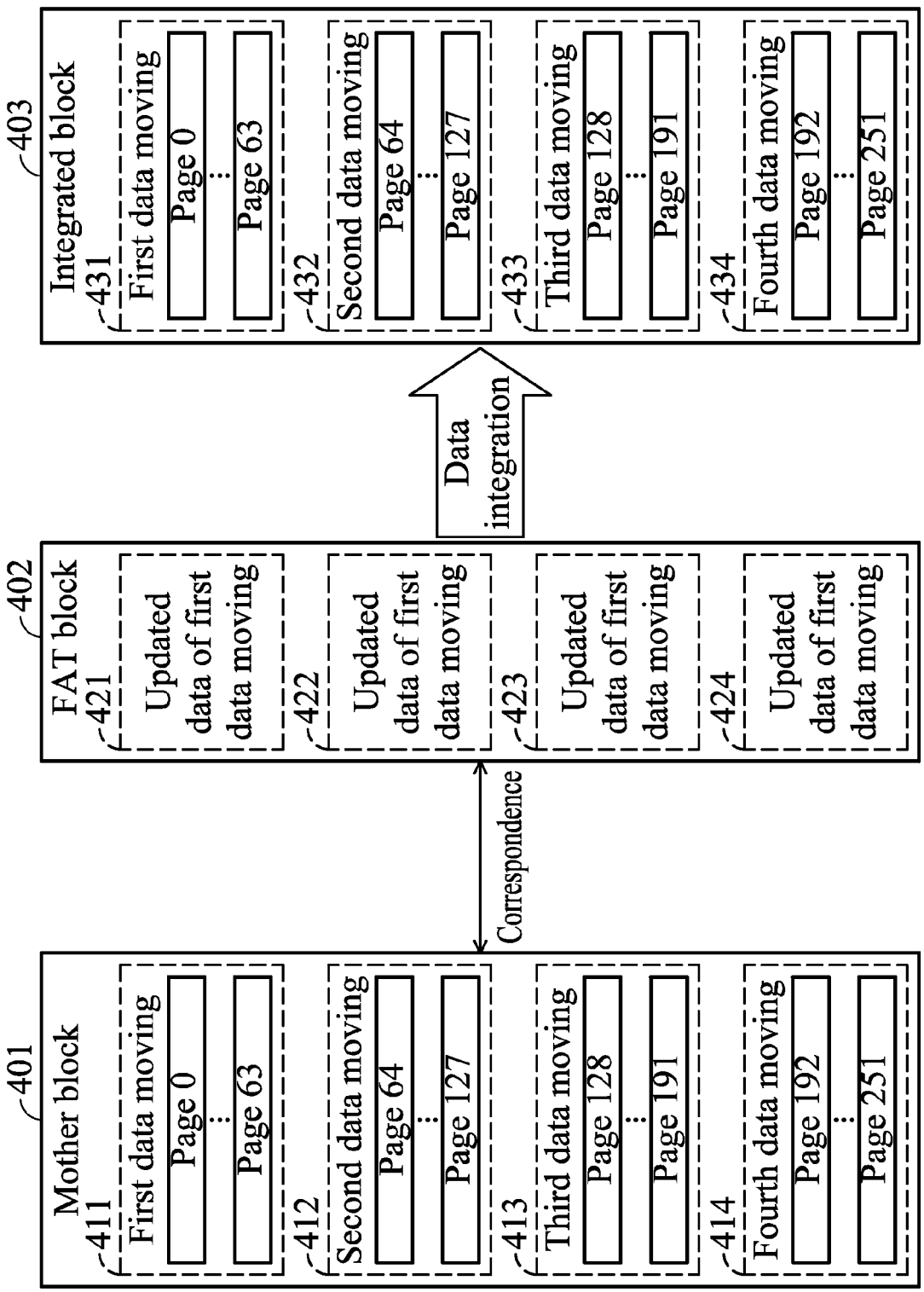
FIG. 4 is a schematic diagram of an embodiment of integration of original data stored in a mother block and update data stored in an FAT block to obtain an integrated block according to the invention.

Referring to FIG. 4, a schematic diagram of an embodiment of integration of original data stored in a mother block 401 and update data stored in an FAT block 402 to obtain an integrated block 402 according to the invention. In one embodiment, the mother block 401 comprises 252 ordinary pages and 4 reserved pages. The 252 ordinary pages storing update data are divided into four groups which are respectively a first group of pages 0~63, a second group of pages 64~127, a third group of pages 128~191, and a fourth group of pages 192~251. The controller 112 first integrates the original data 411 stored in the pages 0~63 with the corresponding update data 421 stored in the FAT block 402 to obtain a first integrated data segment 431. The controller 112 then integrates the original data 412 stored in the pages 64~127 with the corresponding update data 422 stored in the FAT block 402 to obtain a second integrated data segment 432. The controller 112 then integrates the original data 413 stored in the pages 128~191 with the corresponding update data 423 stored in the FAT block 402 to obtain a third integrated data segment 433. The controller 112 then integrates the original data 414 stored in the pages 192~251 with the corresponding update data 424 stored in the FAT block 402 to obtain a fourth integrated data segment 434.

The controller 112 then obtains a spare block as the integrated block 403. During the processing period of a first write command, the controller 112 writes the first integrated data segment to pages 0~63 of the integrated block 403. During the processing period of a second write command, the controller 112 writes the second integrated data segment to pages 64~127 of the integrated block 403. During the processing period of a third write command, the controller 112 writes the third integrated data segment to pages 128~191 of the integrated block 403. During the processing period of a fourth write command, the controller 112 writes the fourth integrated data segment to pages 192~251 of the integrated block 403. If a processing period of a write command is 250 ms, and data writing of a page needs 3 ms, writing of each of the integration data segments to the integrated block 403 then requires 64×3=192 ms which is shorter than the 250 ms processing period of a single write command.

Referring to FIGS. 5A~5D, schematic diagrams of an embodiment of integrating original data stored in a mother block 501 with update data stored in an FAT block to obtain an integrated block 504 according to the invention. The flash memory 114 comprises three blocks 501, 502, and 503. The block 501 comprises 252 ordinary pages corresponding to addresses 0~251 and 4 reserved pages. Similarly, the block 502 comprises 252 ordinary pages corresponding to addresses 252~501 and 4 reserved pages, and the block 503 comprises 252 ordinary pages corresponding to addresses 502~753 and 4 reserved pages. First, the controller 112 receives a first write command, update data, and a write address 180. If the controller 112 determines that execution of the first write command needs data integration of the mother block 501 and a corresponding FAT block, the controller 112 respectively integrates the original data stored in addresses 0~63, 64~17, 128~191, 192~251 with corresponding update data stored in the FAT block to obtain a first integrated data segment, a second integrated data segment, a third integrated data segment, a fourth integrated data segment.

Figure 5A:
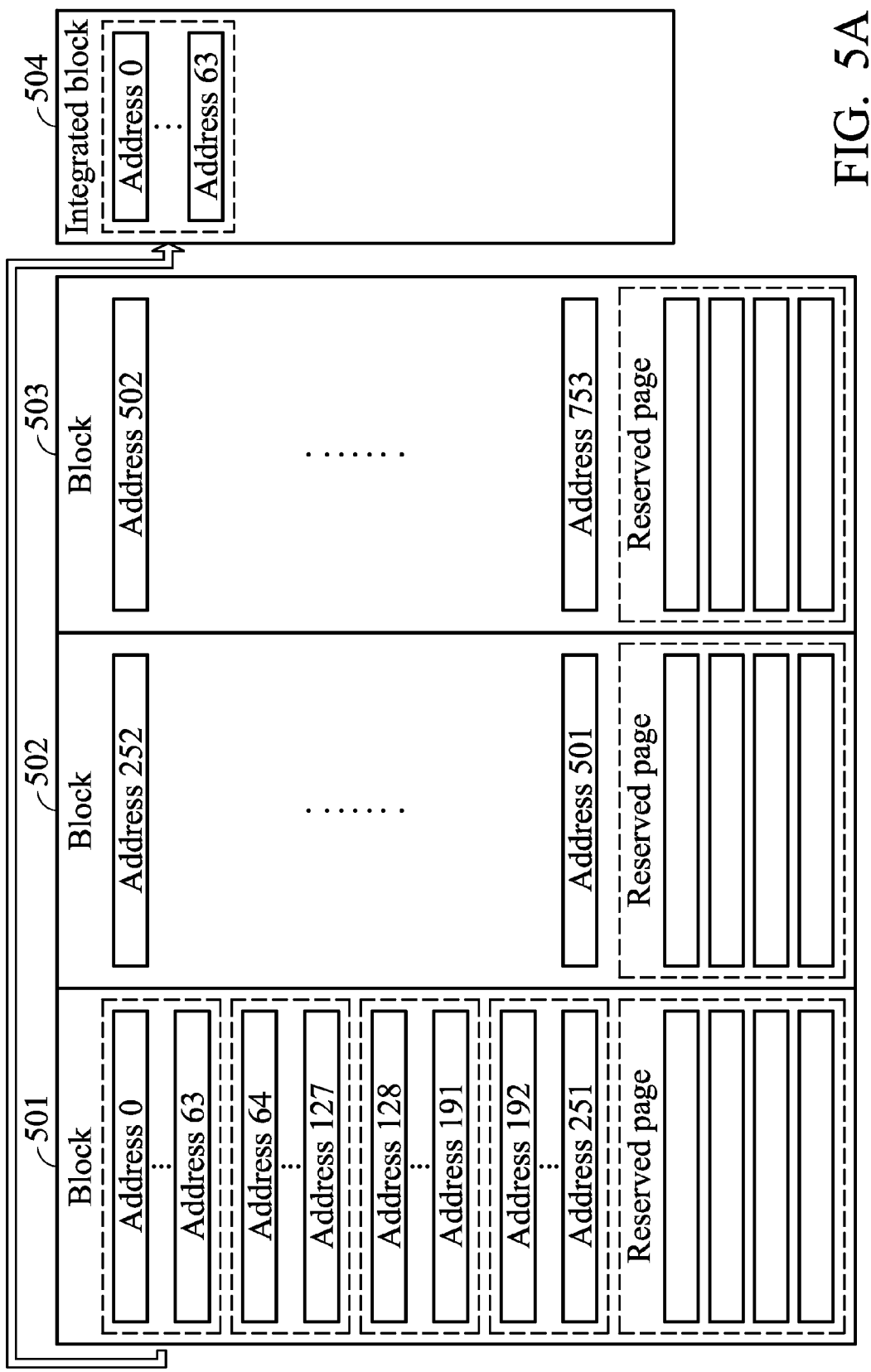
FIGS. 5A~5D are schematic diagrams of an embodiment of integrating original data stored in a mother block with update data stored in an FAT block to obtain an integrated block according to the invention.
Figure 5B:
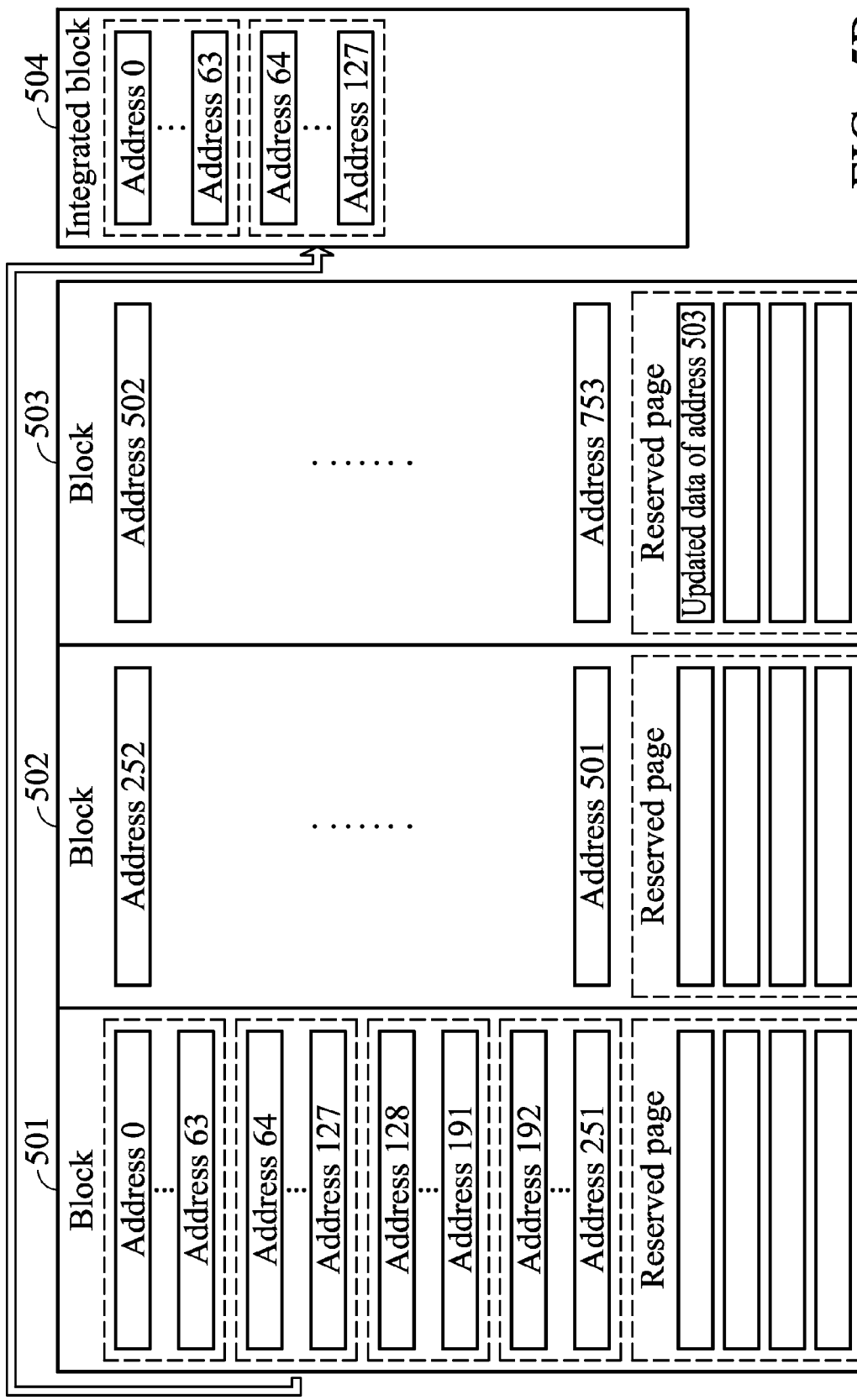

The controller 112 then obtains a spare block from the flash memory 114 as an integrated block 504. During a processing period of the first write command, the controller 112 writes the first integrated data segment to the addresses 0~63 of the integrated block 504, as shown in FIG. 5A. The controller 112 then receives a second write command, second write data, and a write address 503 from the host 102. The write address 503 corresponds to the address range 502~753 of the block 503. Because there is uncompleted data integration of the block 501 in the system, the controller 112 writes the second write data in a first reserved page of the block 503, and then writes the second integrated data segment to the addresses 64~127 of the integrated block 504 during the processing period of the second write command, as shown in FIG. 5B.

Figure 5C:
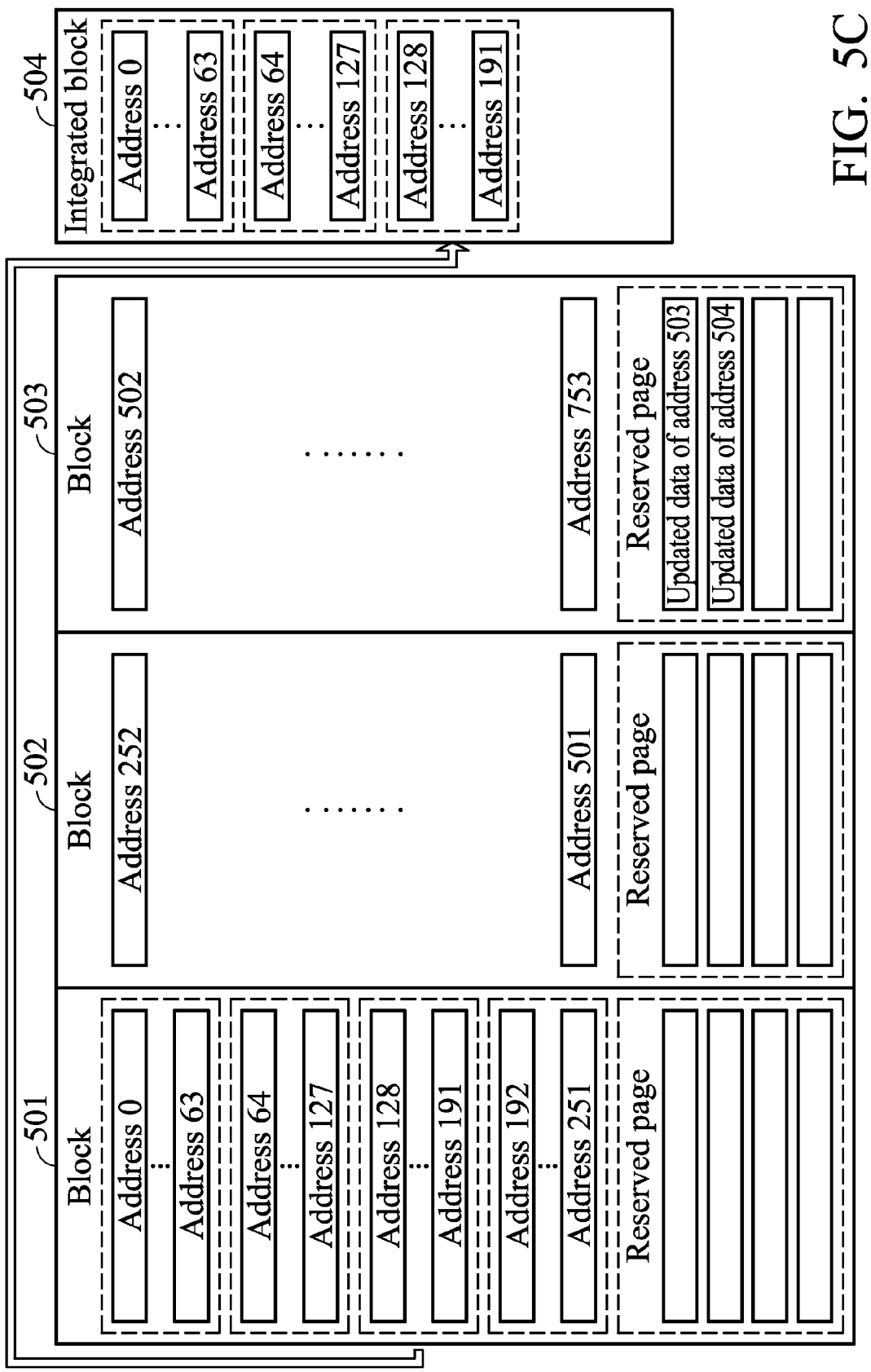
Figure 5D:
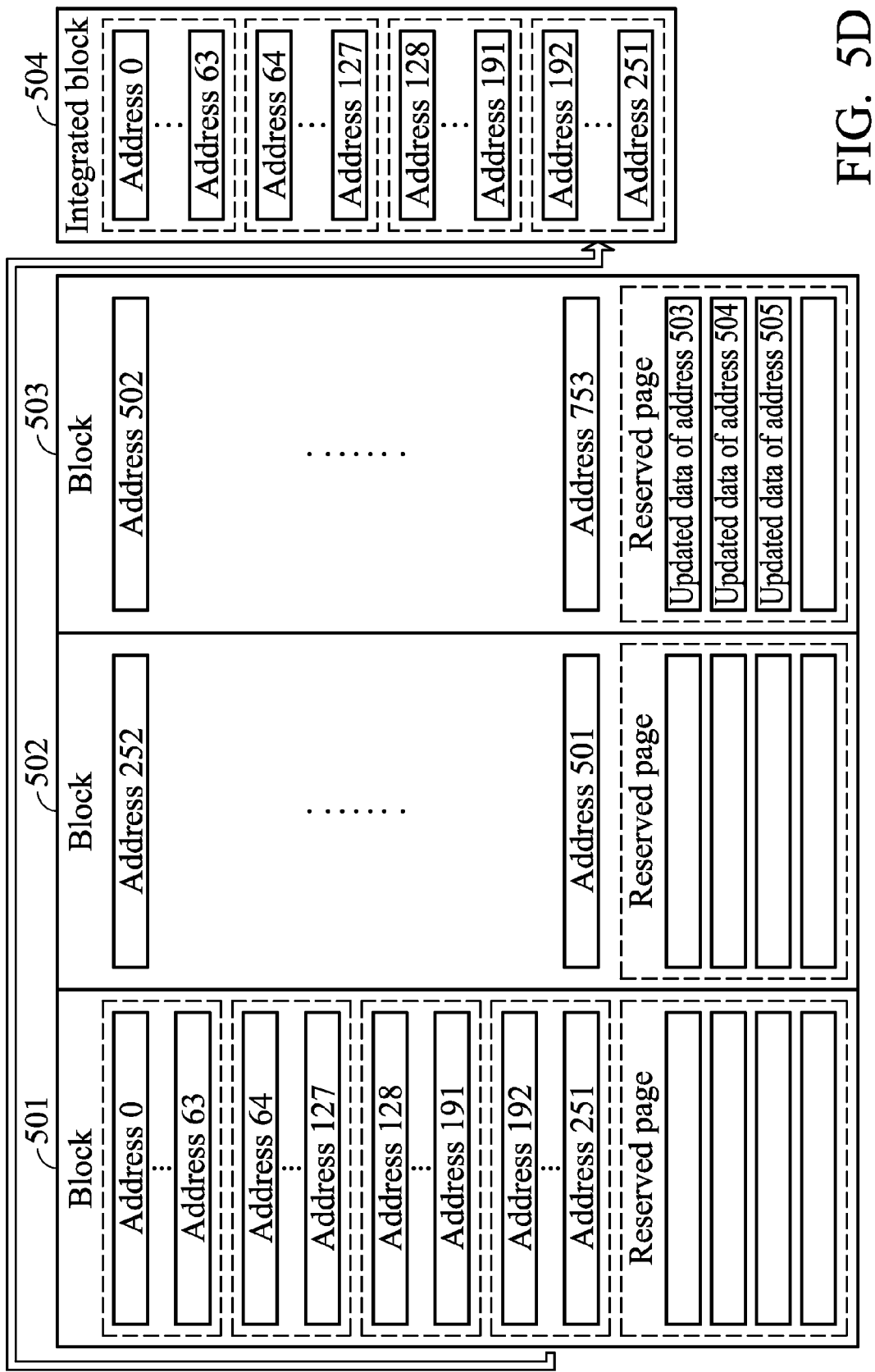

The controller 112 then receives a third write command, third write data, and a write address 504 from the host 102. The write address 504 corresponds to the address range 502~753 of the block 503. Because there is uncompleted data integration of the block 501 in the system, the controller 112 writes the third write data in a second reserved page of the block 503, and then writes the third integrated data segment to the addresses 128~191 of the integrated block 504 during the processing period of the third write command, as shown in FIG. 5C. The controller 112 then receives a fourth write command, fourth write data, and a write address 505 from the host 102. The write address 505 corresponds to the address range 502~753 of the block 503. Because there is uncompleted data integration of the block 501 in the system, the controller 112 writes the fourth write data in a third reserved page of the block 503, and then writes the fourth integrated data segment to the addresses 192~251 of the integrated block 504 during the processing period of the fourth write command, as shown in FIG. 5D.

Referring to FIGS. 7A~7D, schematic diagrams of an embodiment of data integration of ordinary pages and reserved pages of a block 701 to obtain an integrated block 704 according to the invention are shown. The flash memory 114 comprises three blocks 701, 702, and 703. The block 701 comprises 252 ordinary pages corresponding to addresses 0~251 and 4 reserved pages, wherein data has been stored in three reserved page. Similarly, the block 702 comprises 252 ordinary pages corresponding to addresses 252~501 and 4 reserved pages, and the block 703 comprises 252 ordinary pages corresponding to addresses 502~753 and 4 reserved pages. During the remaining processing period of a first write command, the controller 112 searches the reserved page usage table 116 for a block 701 corresponding to the highest reserved page number, and determines to perform data integration of reserved pages and ordinary pages of the block 701. The controller 112 therefore respectively integrates the original data stored in addresses 0~63, 64~17, 128~191, 192~251 of the block 701 with corresponding update data stored in the reserved pages of the block 701 to obtain a first integrated data segment, a second integrated data segment, a third integrated data segment, a fourth integrated data segment.

Figure 7A:
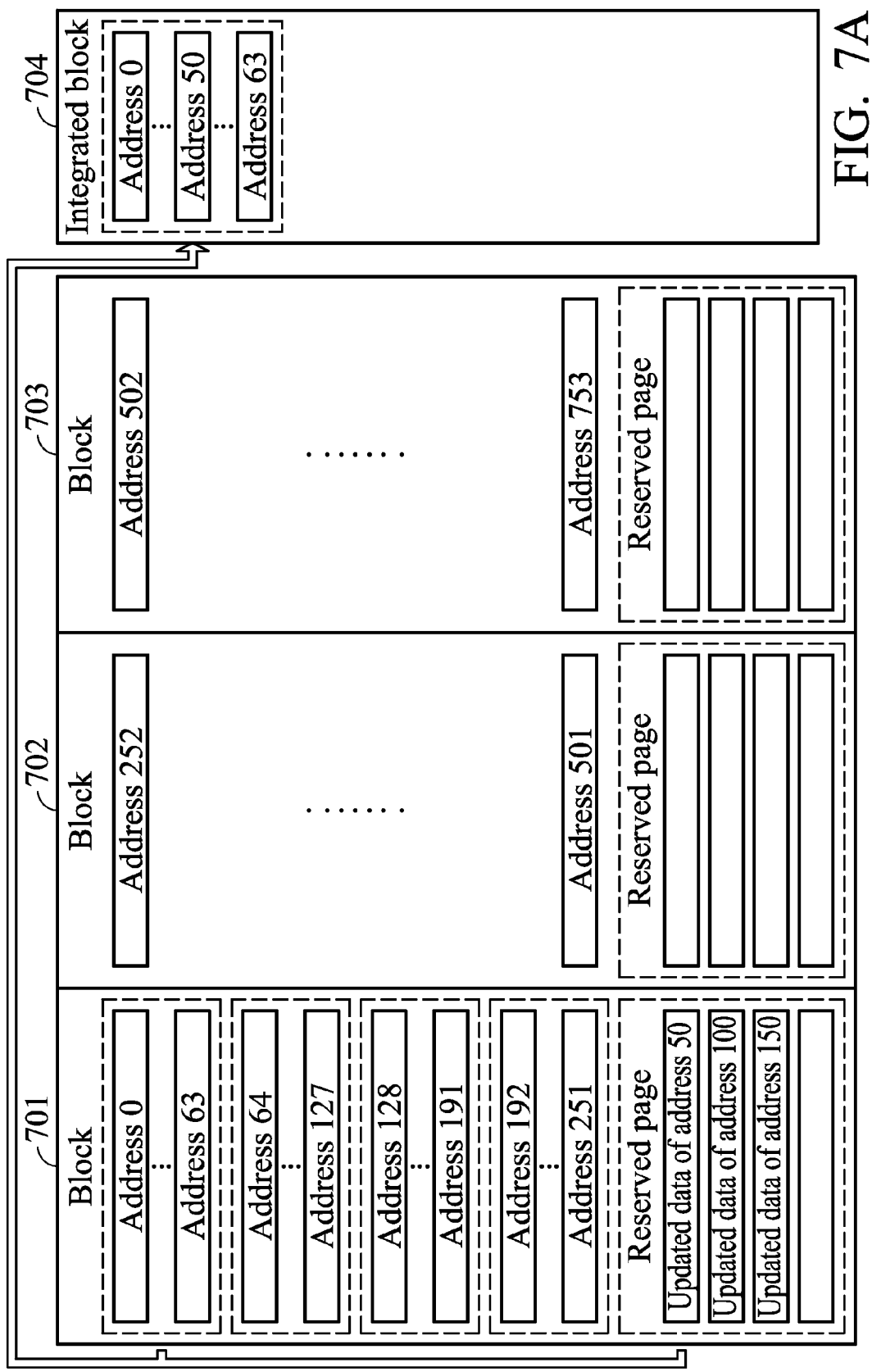
FIGS. 7A~7D are schematic diagrams of an embodiment of data integration of ordinary pages and reserved pages of a block to obtain an integrated block according to the invention.
Figure 7B:
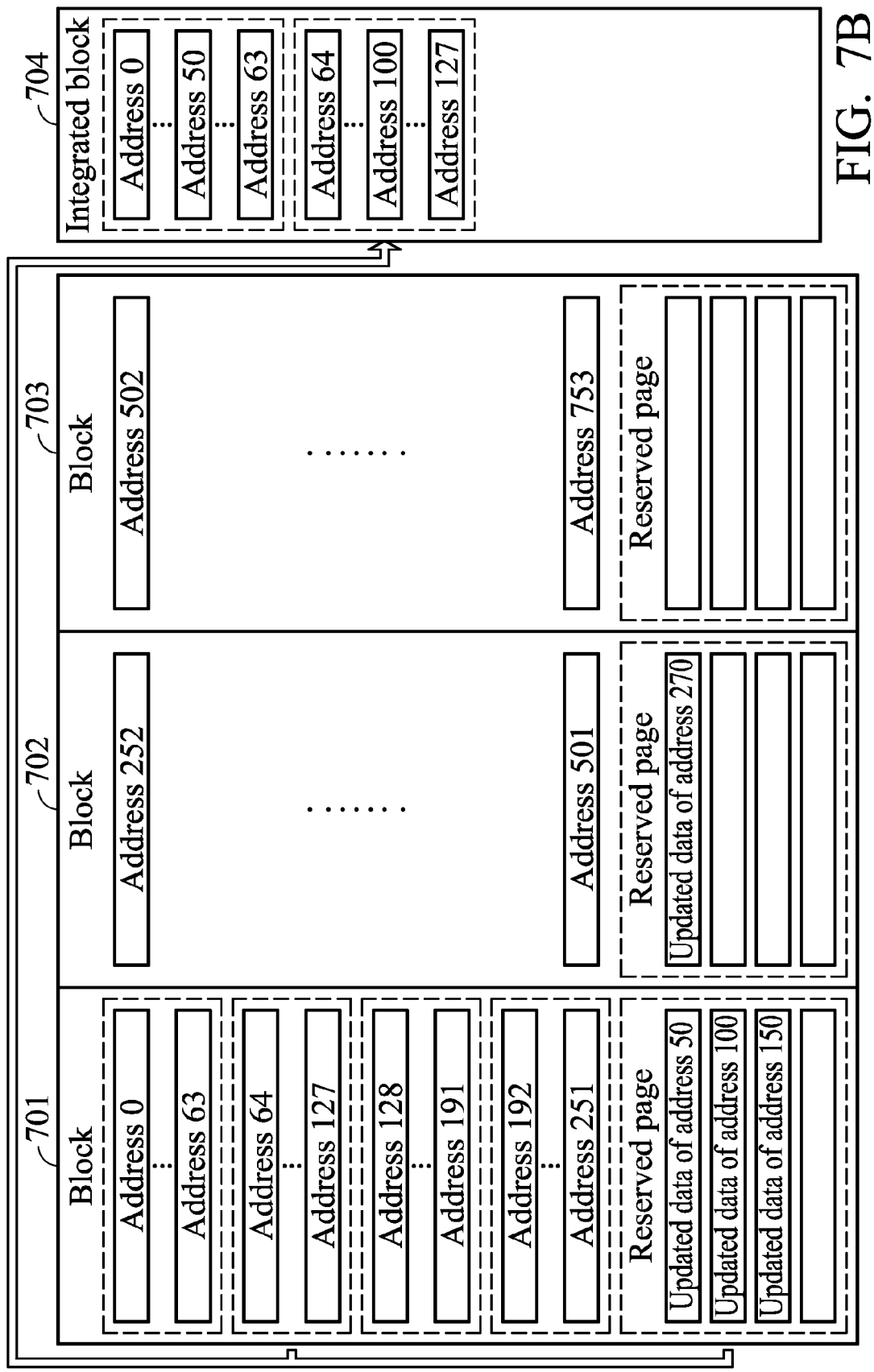

The controller 112 then obtains a spare block from the flash memory 114 as an integrated block 704. During the remaining processing period of the first write command, the controller 112 writes the first integrated data segment to the ordinary pages of the addresses 0~63 of the integrated block 704, as shown in FIG. 7A. The controller 112 then receives a second write command, second write data, and a write address 270 from the host 102. The write address 270 corresponds to the address range 252~501 of the block 702. Because there is uncompleted data integration of the block 701 in the system, the controller 112 writes the second write data in a first reserved page of the block 702, and then writes the second integrated data segment to the addresses 64~127 of the integrated block 704 during the processing period of the second write command, as shown in FIG. 7B.

Figure 7C:
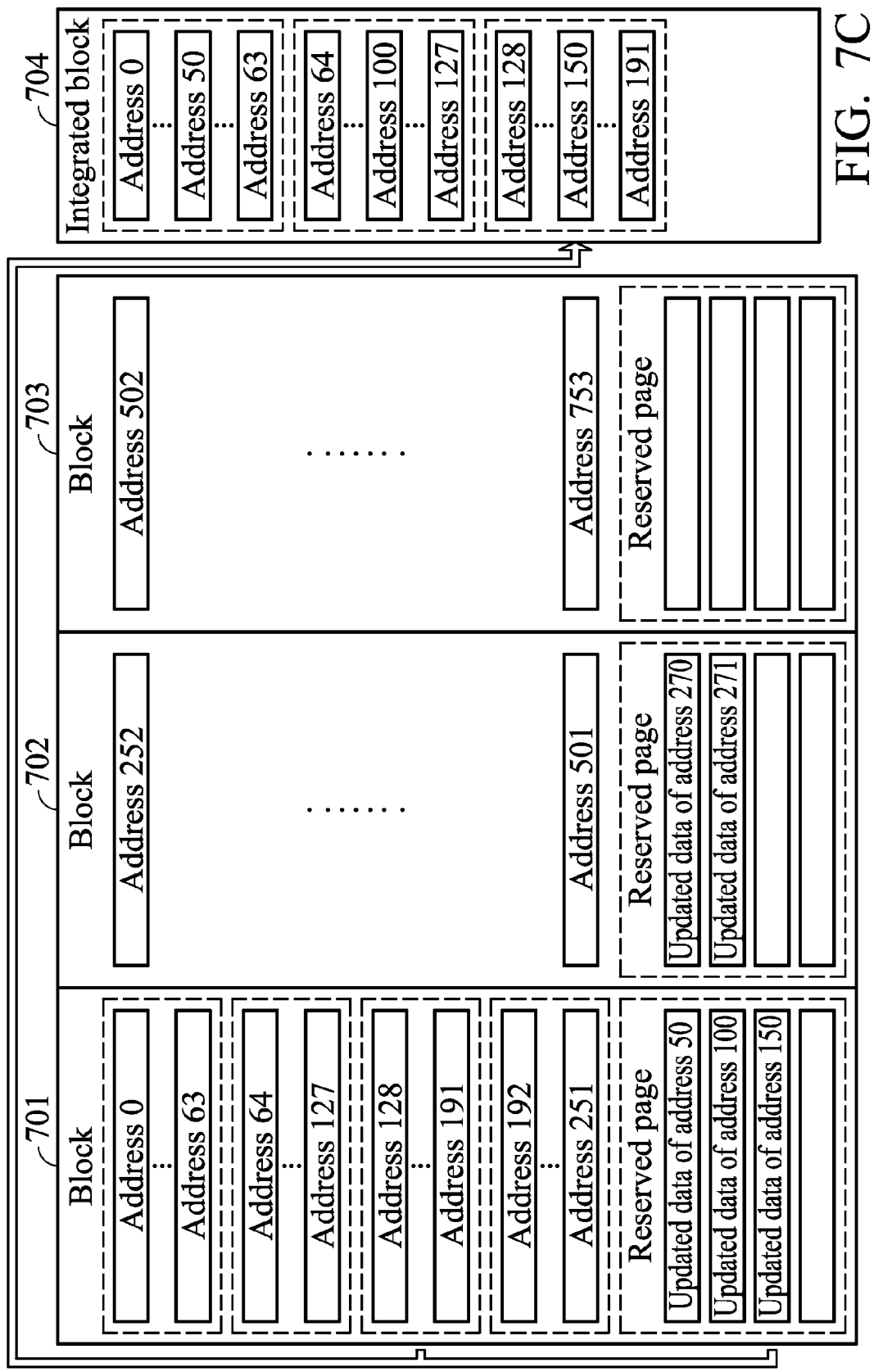
Figure 7D:
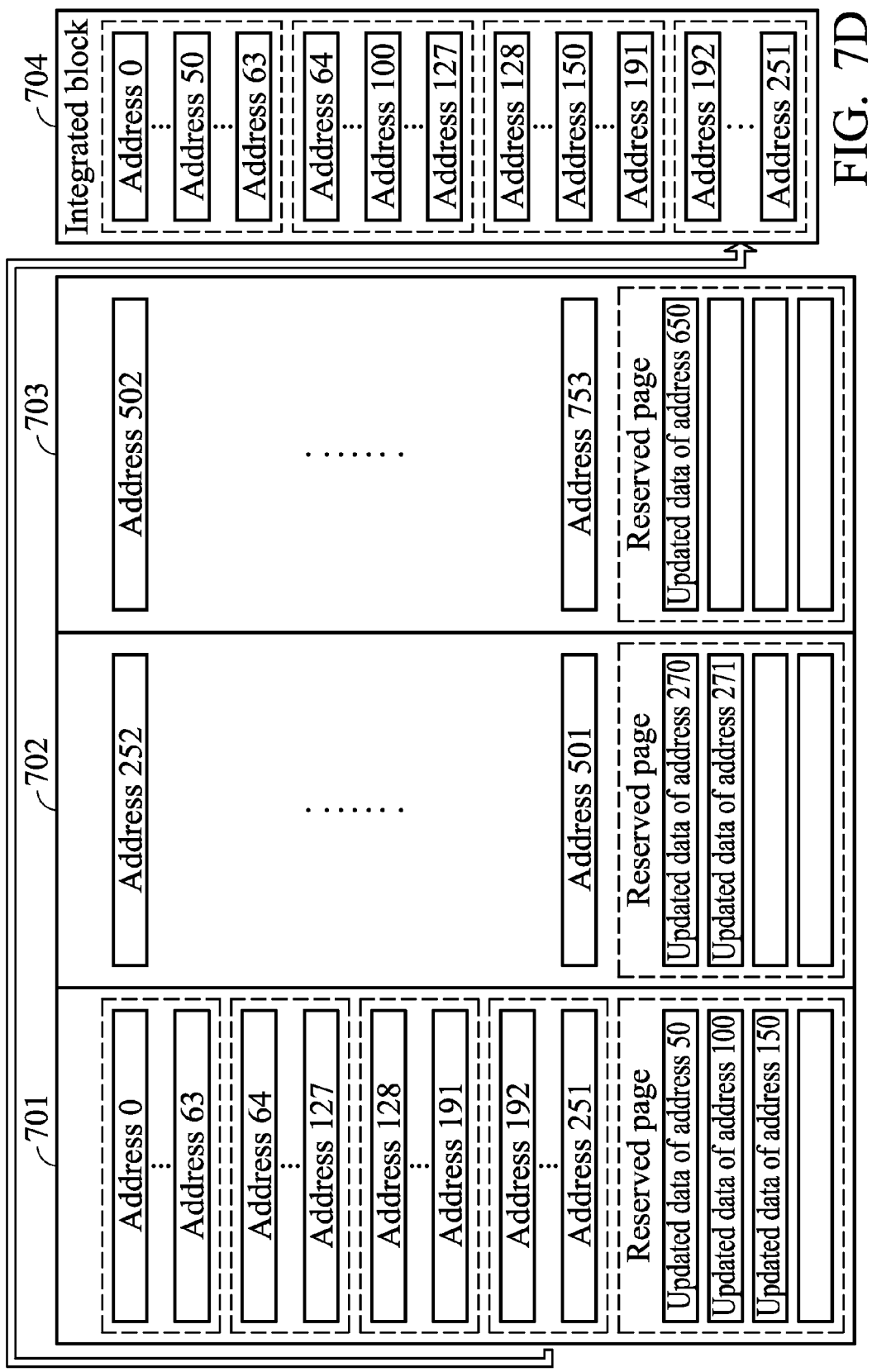

The controller 112 then receives a third write command, third write data, and a write address 271 from the host 102. The write address 271 corresponds to the address range 252~501 of the block 702. Because there is uncompleted data integration of the block 701 in the system, the controller 112 writes the third write data in a second reserved page of the block 702, and then writes the third integrated data segment to the addresses 128~191 of the integrated block 704 during the processing period of the third write command, as shown in FIG. 7C. The controller 112 then receives a fourth write command, fourth write data, and a write address 650 from the host 102. The write address 650 corresponds to the address range 502~753 of the block 703. Because there is uncompleted data integration of the block 701 in the system, the controller 112 writes the fourth write data in a first reserved page of the block 703, and then writes the fourth integrated data segment to the addresses 192~251 of the integrated block 704 during the processing period of the fourth write command, as shown in FIG. 7D.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flash storage device, coupled to a host, comprising:
   a flash memory, comprising a plurality of blocks, wherein each of the blocks comprises a plurality of ordinary pages and a plurality of reserved pages; and
   a controller, receiving a current write command and write data from the host, determining a mother block corresponding to the write command, and determining whether data integration of the mother block and a file allocation table (FAT) block is needed in execution of the current write command, and when the data integration is needed, dividing data of the mother block and data of the FAT block into a plurality of original groups and a plurality of updating groups, each of the original groups has a plurality of pages arranged to constitute an original data segment, each of the updating groups has a plurality of pages arranged to constitute a updating data segment, integrating the original data segments with the updating data segments to obtain integrated data segments, receiving a plurality of subsequent write commands and subsequent write data from the host, writing the integrated data segments to an integrated block respectively in a plurality of processing periods of the subsequent write commands, and writing the subsequent write data to the reserved pages of a plurality of subsequent blocks corresponding to the subsequent write commands during the processing periods of the subsequent write commands, wherein the controller records numbers of the reserved pages used by the blocks in a reserved page usage table, wherein when the controller is in an idle state, the controller searches the reserved page usage table for a target block having the highest number of the used reserved pages, and performs data integration of the reserved pages and the ordinary pages of the target block.

2. The flash storage device as claimed in claim 1, wherein the controller determines whether data has been stored in the write address of the mother block, determines whether the FAT block corresponding to the mother block exists in the flash memory when the data has been stored in the write address, writes the write data to the FAT block when the FAT block exists in the flash memory, determines whether the FAT block is full of data, and determines to perform data integration of the mother block and the FAT block when the FAT block is full of data.

3. The flash storage device as claimed in claim 2, wherein when the FAT block does not exist in the flash memory, the controller obtains a spare block from the flash memory as the FAT block corresponding to the mother block, and writes the write data to the FAT block.

4. The flash storage device as claimed in claim 2, wherein when there is no data being stored in the write address of the mother block, the controller writes the write data to the write address of the mother block.

5. The flash storage device as claimed in claim 1, wherein when data integration of the reserved pages and the ordinary pages of the target block is performed, the controller divides user data stored in the ordinary pages into a plurality of ordinary data segments according to addresses of the user data, respectively integrates the ordinary data segments with corresponding updated data stored in the reserved pages to obtain a plurality of second integrated segments, receives a plurality of second subsequent write commands from the host, and respectively writes the second integrated segments into a second integrated block during the processing periods of the second subsequent write commands.

6. The flash storage device as claimed in claim 1, wherein the number of the reserved pages of each of the blocks of the flash memory is greater than a quotient obtained by dividing a time period for writing data to all of the ordinary pages of a block by a processing period of a write command.

7. A data writing method of a flash storage device, wherein the flash storage device is coupled to a host and comprises a flash memory comprising a plurality of blocks, and each of the blocks comprises a plurality of ordinary pages and a plurality of reserved pages, comprising:

receiving a current write command and write data from the host;

determining a mother block corresponding to the write command;

determining whether data integration of the mother block and a file allocation table (FAT) block is needed in execution of the current write command;

when the data integration is needed, dividing data of the mother block and data of the FAT block into a plurality of original groups and a plurality of updating groups, wherein each of the original groups has a plurality of pages arranged to constitute an original data segment, and each of the updating groups has a plurality of pages arranged to constitute a updating data segment;

integrating the original data segments with the updating data segments to obtain integrated data segments;

receiving a plurality of subsequent write commands and subsequent write data from the host;

writing the integrated data segments to an integrated block respectively in a plurality of processing periods of the subsequent write commands; and writing the subsequent write data to the reserved pages of a plurality of subsequent blocks corresponding to the subsequent write commands during the processing periods of the subsequent write commands;

recording numbers of the reserved pages used by the blocks in a reserved page usage table;

searching the reserved page usage table for a target block having the highest number of the used reserved pages; and performing data integration of the reserved pages and the ordinary pages of the target block.

8. The data writing method as claimed in claim 7, wherein determination of whether data integration of the mother block and the FAT block is needed in execution of the current write command comprises:

determining whether data has been stored in the write address of the mother block;

when the data has been stored in the write address, determining whether the FAT block corresponding to the mother block exists in the flash memory;

when the FAT block exists in the flash memory, writing the write data to the FAT block;

determining whether the FAT block is full of data; and when the FAT block is full of data, determining to perform data integration of the mother block and the FAT block.

9. The data writing method as claimed in claim 8, wherein determination of whether data integration of the mother block and the FAT block is needed in execution of the current write command further comprises:

when the FAT block does not exist in the flash memory, obtaining a spare block from the flash memory as the FAT block corresponding to the mother block, and writing the write data to the FAT block.

10. The data writing method as claimed in claim 8, wherein determination of whether data integration of the mother block and the FAT block is needed in execution of the current write command further comprises:

when there is no data being stored in the write address of the mother block, writing the write data to the write address of the mother block.

11. The data writing method as claimed in claim 7, wherein data integration of the reserved pages and the ordinary pages of the target block comprises:

dividing user data stored in the ordinary pages into a plurality of ordinary data segments according to addresses of the user data;

respectively integrating the ordinary data segments with corresponding updated data stored in the reserved pages to obtain a plurality of second integrated segments;

receiving a plurality of second subsequent write commands from the host; and respectively writing the second integrated segments into a second integrated block during the processing periods of the second subsequent write commands.

12. The data writing method as claimed in claim 7, wherein the number of the reserved pages of each of the blocks of the flash memory is greater than a quotient obtained by dividing a time period for writing data to all of the ordinary pages of a block by a processing period of a write command.

* * * * *